(12) United States Patent
Luo

(10) Patent No.: US 7,683,878 B2
(45) Date of Patent: Mar. 23, 2010

(54) SYSTEMS FOR PROVIDING DUAL RESOLUTION CONTROL OF DISPLAY PANELS

(75) Inventor: Ping Luo, Hsinchu (TW)

(73) Assignee: TPO Displays Corp., Miao-Li County (TW)

(*) Notice: Subject to any disclaimer, the term of this patent is extended or adjusted under 35 U.S.C. 154(b) by 917 days.

(21) Appl. No.: 11/337,631

(22) Filed: Jan. 23, 2006

(65) Prior Publication Data
US 2007/0171243 A1    Jul. 26, 2007

(51) Int. Cl.
G09G 3/36    (2006.01)
(52) U.S. Cl. .................................. 345/100; 345/698
(58) Field of Classification Search ................. 345/204, 345/698, 87–100; 377/64
See application file for complete search history.

(56) References Cited

U.S. PATENT DOCUMENTS

| | | | |
|---|---|---|---|
| 6,362,643 B1 | 3/2002 | Kim | 324/770 |
| 6,747,626 B2 | 6/2004 | Chiang | 345/98 |
| 6,778,103 B2 | 8/2004 | Satoh | 341/51 |
| 6,788,280 B2 | 9/2004 | Ham | 345/89 |
| 6,795,050 B1 | 9/2004 | Ino et al. | 345/100 |
| 2002/0163493 A1* | 11/2002 | Matsushima et al. | 345/98 |
| 2003/0030615 A1* | 2/2003 | Maeda et al. | 345/90 |
| 2004/0008173 A1 | 1/2004 | Maeda et al. | 345/99 |
| 2005/0068287 A1 | 3/2005 | Lin et al. | 345/100 |
| 2006/0001637 A1* | 1/2006 | Pak et al. | 345/100 |
| 2007/0159502 A1* | 7/2007 | Luo | 345/698 |

FOREIGN PATENT DOCUMENTS

JP    2003-44013    2/2003

OTHER PUBLICATIONS

Japanese language office action dated Sep. 29, 2009.
English language translation of abstract of JP2003-44013 (published Feb. 14, 2003).

* cited by examiner

*Primary Examiner*—Regina Liang
(74) *Attorney, Agent, or Firm*—Thomas, Kayden, Horstemeyer & Risley

(57) ABSTRACT

Systems for providing dual resolution control of display panels are provided. A representative system incorporates two pairs of shift registers, each of the shift registers outputting a shifting signal; two pairs of logic gates; and a switching network coupled among the shifting registers and the logic gates. In a low resolution mode, the switching network causes the shift registers to output shifting signals, with corresponding pulses of the shifting signals of the shift registers of the first pair temporally overlapping with corresponding pulses of the shifting signals of the shift registers of the second pair; and wherein, responsive to the shifting signals, the logic gates output panel control signals, with corresponding pulses of the panel control signals of the logic gates of the first pair not temporally overlapping with corresponding pulses of the panel control signals of the logic gates of the second pair.

17 Claims, 8 Drawing Sheets

SYSTEMS FOR PROVIDING DUAL RESOLUTION CONTROL OF DISPLAY PANELS

BACKGROUND OF THE INVENTION

1. Field of the Invention

The present invention relates to dual resolution control of display panels.

2. Description of the Related Art

Display panels are driven by a series of panel control signals, such as the panel control signals 105~108 depicted in FIG. 1. These panel control signals provide a series of pulses, which are used to switch data signals into correct data lines for correct pixels, and to load data signals into pixels on each scan line. Panel control signals are usually generated from shifting signals, such as the shifting signals 101~104 in FIG. 1.

FIG. 2 is a schematic diagram showing part of the conventional control circuit 200 for generating panel control signals. The control circuit 200 comprises shift registers, logic gates and a switching network 100. Each of the shift registers SR1~SR4 receives clock signals CK1 and CK2, as well as a corresponding shifting signal (101~104) from a previous shift register. Each of the shift registers also outputs its own shifting signal to a next shift register, to a corresponding logic gate, and to a next logic gate. The clock signals CK1 and CK2 have the same frequency and are always in opposite phases, as depicted in FIG. 3. Each of the logic gates G1~G4 receives two shifting signals and outputs a panel control signal (105~108). The logic gates G1~G4 in the control circuit 200 are AND gates to generate panel control signals with high pulses. Thus, logic gates G1~G4 generate the panel control signals 105~108 according to the shifting signals 101~104, which are generated from switching network 100.

For many applications, it is desirable to have display panels support two resolutions, usually a high resolution, such as the VGA (video graphic array) resolution of 640 columns by 480 rows, and a low resolution, such as the QVGA (quarter video graphic array) resolution of 320 columns by 240 rows. In this regard, low resolution typically is achieved by filling identical data into adjacent pixels, so that four adjacent pixels are consolidated into a larger pixel. To implement such low resolution, panel control signals typically are synchronized into pairs, such as shown by the panel control signals 401~404 in FIG. 4. Notably, the interconnection among shift registers and logic gates typically has to be adjusted for changing resolution. The adjustment is usually implemented with a switching network.

Regarding switching network 100, in some conventional designs, half of the existing shift registers may not used when the display panel scans upward or downward in the low resolution mode. Unused shift registers are in a floating state and tend to accumulate charges. If the voltage generated by accumulated charges is higher than the highest operating voltage of the display panel or lower than the lowest operating voltage of the display panel, there can be errant operations in the display panel, potentially causing abnormalities.

SUMMARY OF THE INVENTION

Systems for providing dual resolution control of display panels are provided. In this regard, an embodiment of such a system comprises: a first pair and a second pair of shift registers, each of the shift registers outputting a shifting signal; a first pair and a second pair of logic gates; and a switching network coupled among the shifting registers and the logic gates. In a low resolution mode, the switching network causes the shift registers to output shifting signals, with corresponding pulses of the shifting signals of the shift registers of the first pair temporally overlapping with corresponding pulses of the shifting signals of the shift registers of the second pair; and wherein, responsive to the shifting signals, the logic gates output panel control signals, with corresponding pulses of the panel control signals of the logic gates of the first pair not temporally overlapping with corresponding pulses of the panel control signals of the logic gates of the second pair. Another embodiment of such a system comprises: a dual resolution control circuit operative to provide a plurality of panel control signals the control circuit comprising four shift registers, each of the shift registers outputting a shifting signal; four logic gates; a switching network coupled among the shifting registers and the logic gates; and a pixel array for displaying an image by loading the image signal into a plurality of pixels of the pixel array in response to the panel control signals. In a low resolution mode, the switching network directs the shifting signals to the shift registers such that each of the first and the third shift registers outputs a first shifting signal and each of the second and the fourth shift registers outputs a second shifting signal, the switching network also directs the shifting signals to the logic gates such that each of the first and the second logic gates outputs a first panel control signal and each of the third and the fourth logic gates outputs a second panel control signal, and wherein pulses of the first and the second panel control signals do not overlap.

Another embodiment of such a system comprises: a dual resolution control circuit comprising: first, second, third and fourth shift registers, each of the shift registers outputting a shifting signal; first, second, third and fourth logic gates; and a switching network, coupled among the shifting registers and the logic gates. In a low resolution mode, the switching network directs the shifting signals to the shift registers such that each of the first and the third shift registers outputs a first shifting signal and each of the second and the fourth shift registers outputs a second shifting signal, the switching network also directs the shifting signals to the logic gates such that each of the first and the second logic gates outputs a first panel control signal and each of the third and the fourth logic gates outputs a second panel control signal, and wherein pulses of the first and the second panel control signals do not overlap.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
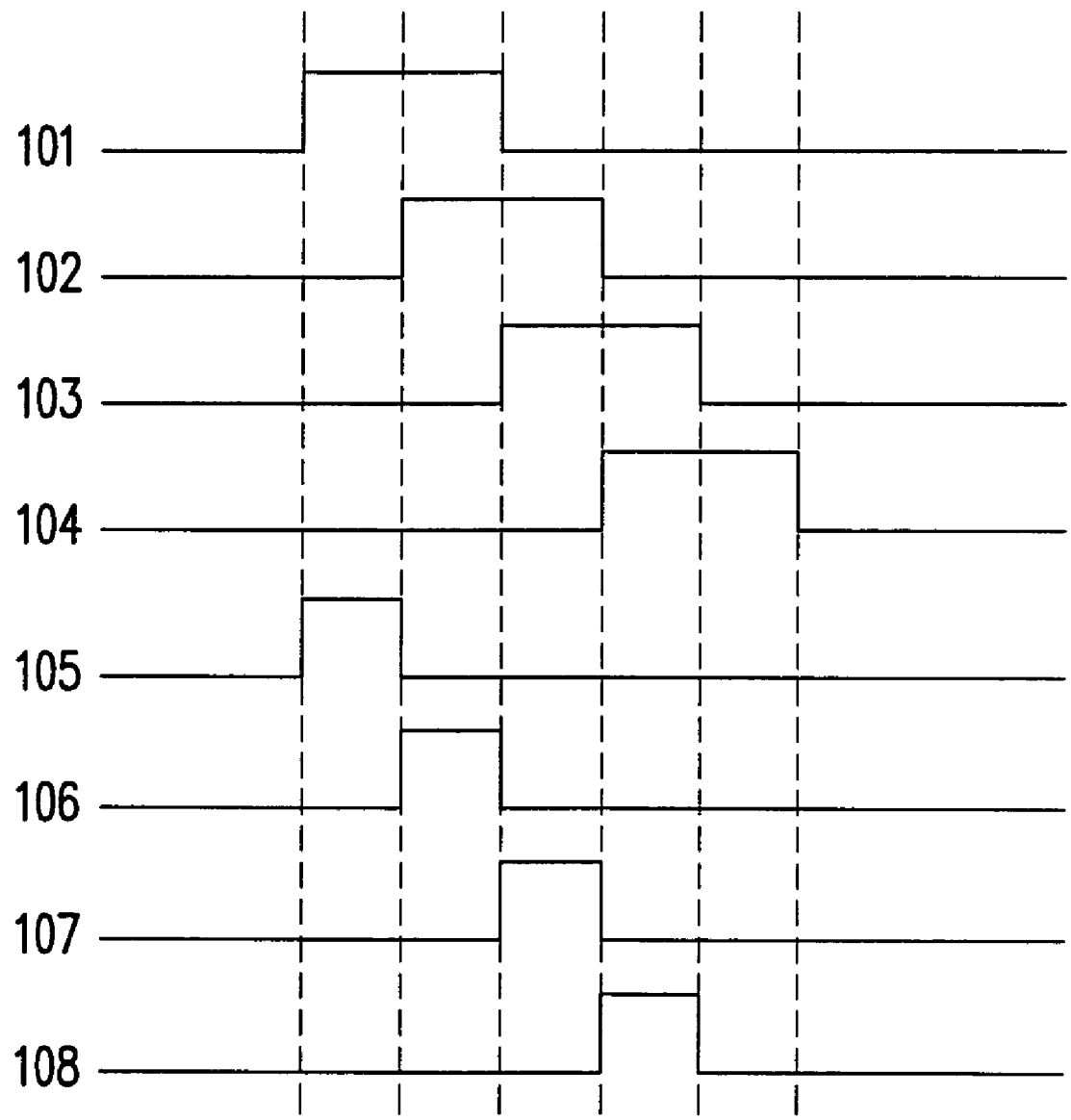
FIG. 1 shows an example of shifting signals and panel control signals used to drive display panels.
Figure 2:
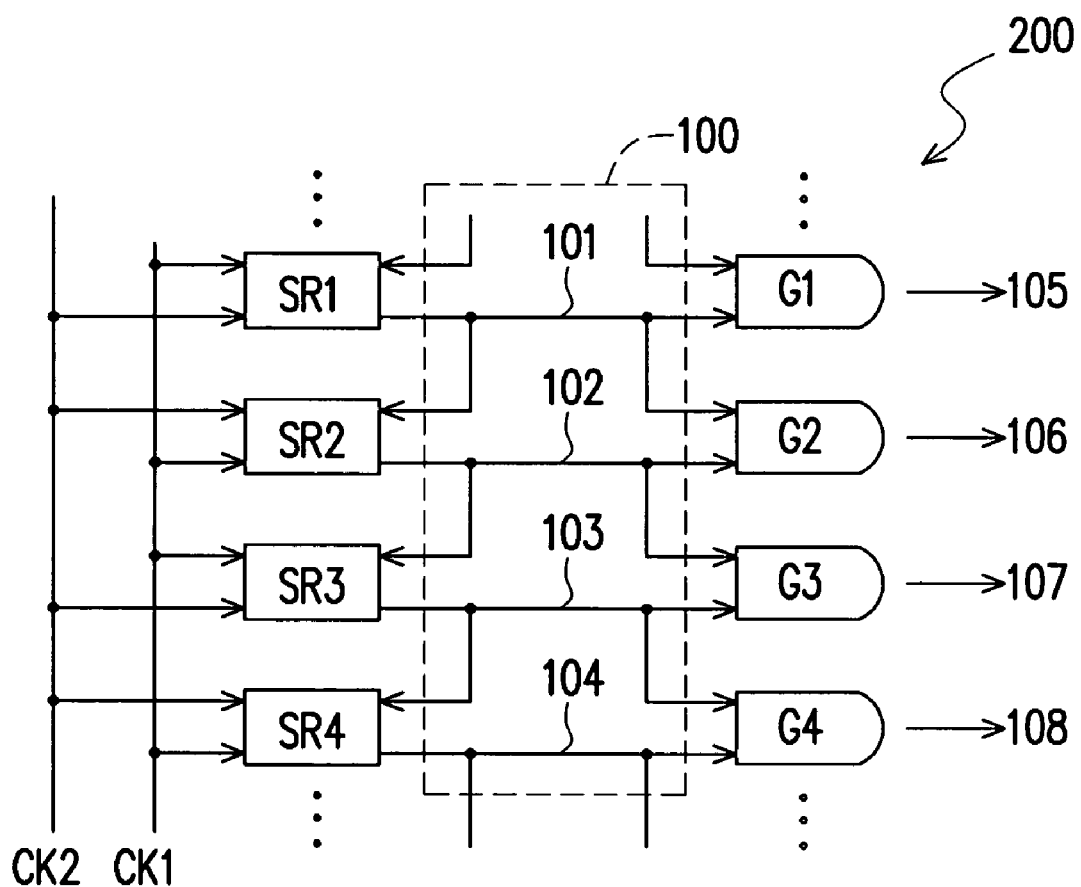
FIG. 2 is a schematic diagram showing part of a conventional control circuit for an display panel.

Reference will now be made in detail to the present preferred embodiments of the invention, examples of which are illustrated in the accompanying drawings. Wherever possible, the same reference numbers are used in the drawings and the description to refer to the same or like parts.

Figure 5:
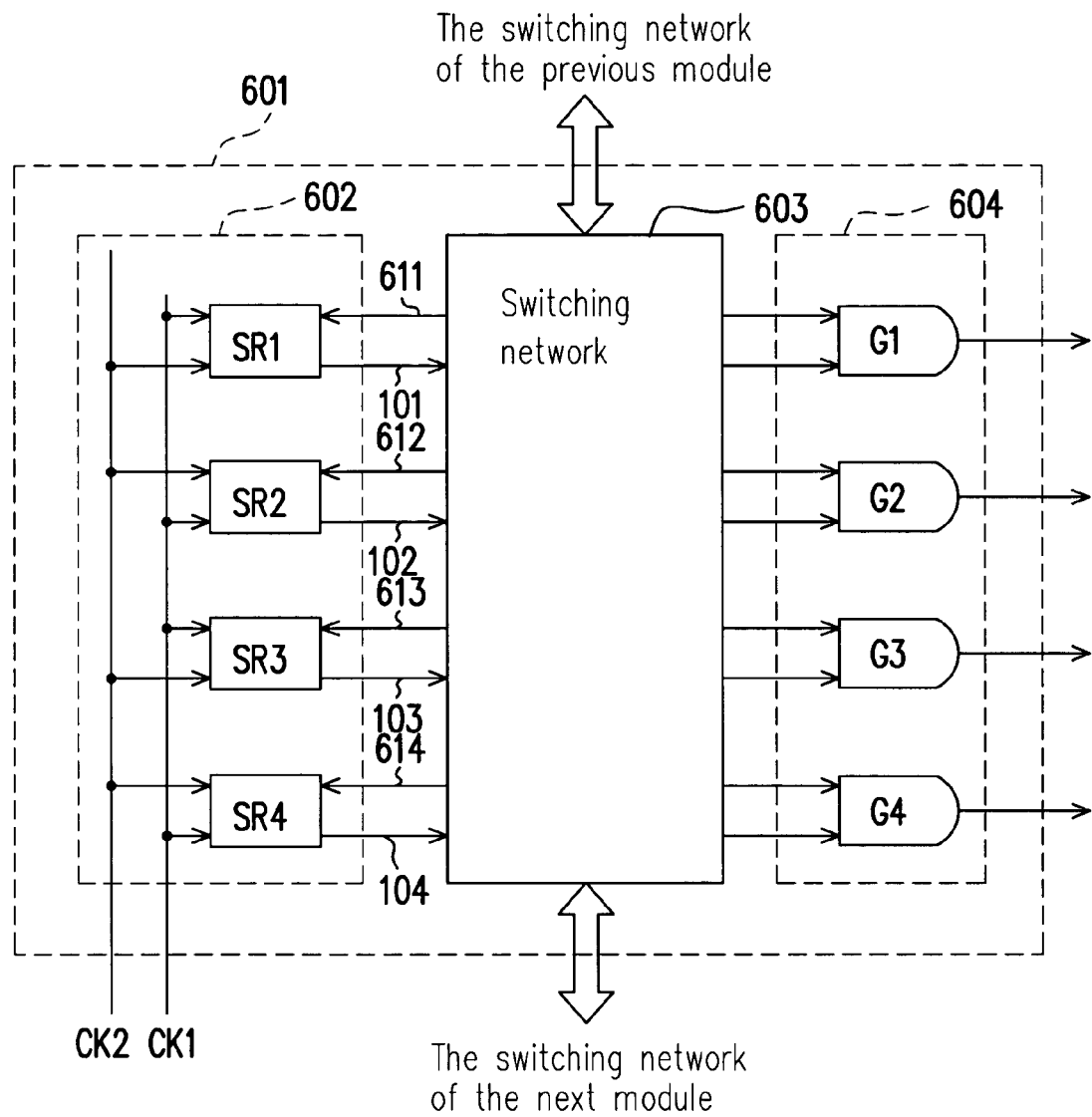
FIG. 5 is a schematic diagram showing a module of a dual resolution control circuit according to an embodiment of the present invention.

In this regard FIG. 5 is a module of a dual resolution control circuit. The module 601 comprises a shift register array 602, a switching network 603 and a logic gate array 604.

The shift register array 602 comprises a plurality of shift registers. In this embodiment, there are four shift registers (SR1~SR4) in the shift register array 602. Each of the shift registers SR1~SR4 receives the first clock signal CK1 and the second clock signal CK2, receives a shifting signal (611~614) from another shift register as its start pulse input, and outputs its own shifting signal (101~104). The switching network 603 decides which shift register receives which shifting signal as its start pulse input.

Figure 3:
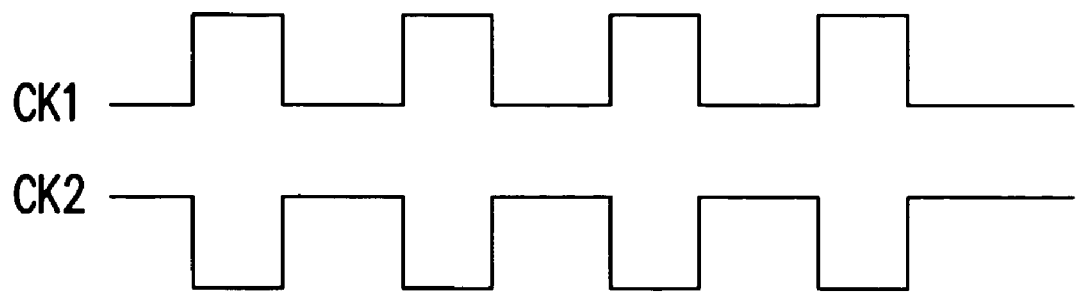
FIG. 3 shows an example of conventional clock signals used by shift registers of control circuits for display panels.
Figure 4:
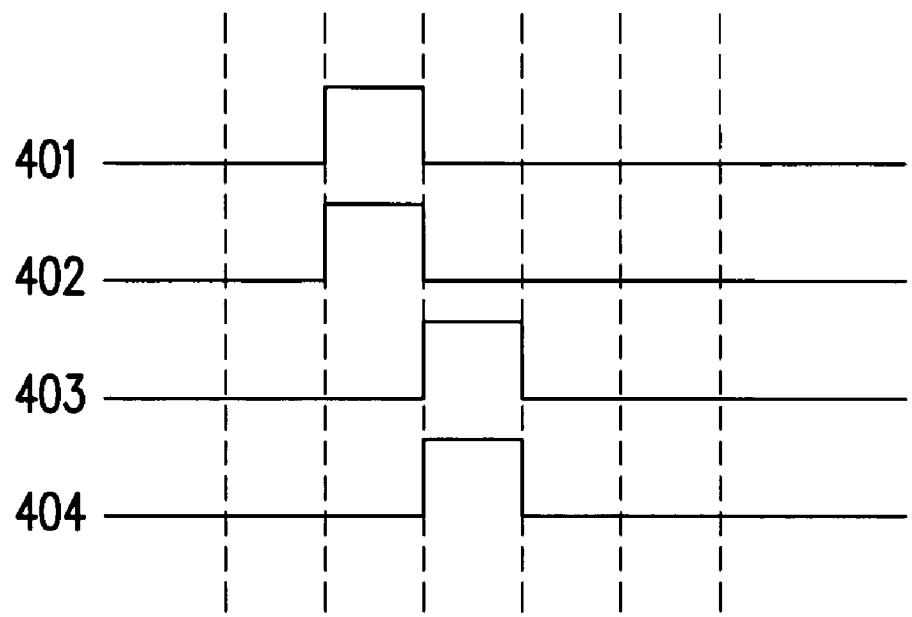
FIG. 4 shows an example of conventional panel control signals used to drive display panels in a low resolution mode.

In this embodiment, the shift registers at odd locations (SR1 and SR3) receive the first clock signal CK1 their first inputs and the second clock signal CK2 as their second inputs. The shift registers at even locations (SR2 and SR4) receive the first clock signal CK1 as their second inputs and the second clock signal CK2 as their first inputs. The first clock signal CK1 and the second clock signal CK2 have the same frequency and are in opposite phases, as depicted in FIG. 3.

The logic gate array 604 comprises a plurality of logic gates. In this embodiment, there are four logic gates (G1~G4) in the logic gate array 604. Each of the logic gates G1~G4 receives two of the shifting signals and outputs a panel control signal. The switching network 603 decides which logic gate receives which shifting signals. In this embodiment, the logic gates G1~G4 are AND gates to output panel control signals with high pulses. In some embodiments of the present invention, each of the AND gates is emulated by an NAND gate and an inverter connected in series. In some embodiments of the present invention, the logic gates G1~G4 are NAND gates to output panel control signals with low pulses. Similarly, in some embodiments of the present invention, each of the NAND gates is emulated by an AND gate and an inverter connected in series.

The switching network 603 is coupled among the shifting register array 602, the logic gate array 604, and the switching networks of the previous and the next modules. For many applications, it is desirable to have display panels support a dual resolution and a dual scan direction (both upward and downward). Therefore, the switching network 603 is configured to direct the correct shifting signals to the correct shift registers and the correct logic gates to generate the correct panel control signals, regardless of whether the display panel is in a high resolution mode or in a low resolution mode, or whether the display panel is scanning upward or downward.

Figure 6:
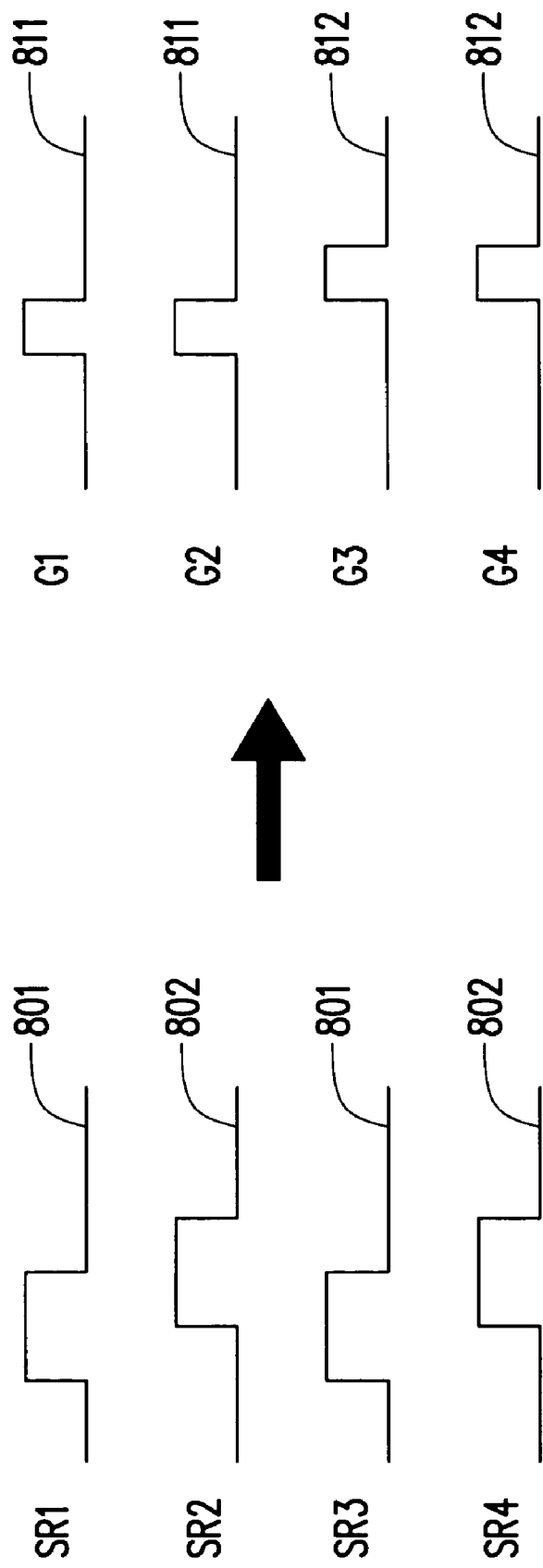
FIG. 6 is a schematic diagram showing the sequence of the operation principle of a dual resolution control circuit according to an embodiment of the present invention.

When the display panel operates in the low resolution mode, the sequence of the operation principle of the present invention is illustrated in FIG. 6, wherein the switching network 603 directs the shifting signals to the shift registers such that each of the shift registers SR1 and SR3 outputs a first shifting signal 801 and each of the shift registers SR2 and SR4 outputs a second shifting signal 802. When the display panel operates in the low resolution mode, the switching network 603 also directs the shifting signals to the logic gates G1~G4 such that each of the logic gates G1 and G2 outputs a first panel control signal 811 and each of the logic gates G3 and G4 outputs a second panel control signal 812. The sequence of the panel control signals 811 and 812 do not overlap. Moreover, the pulse duration of each of the shifting signals 801 and 802 is at least twice as long as the pulse duration of each of the panel control signals 811 and 812.

Figure 7:
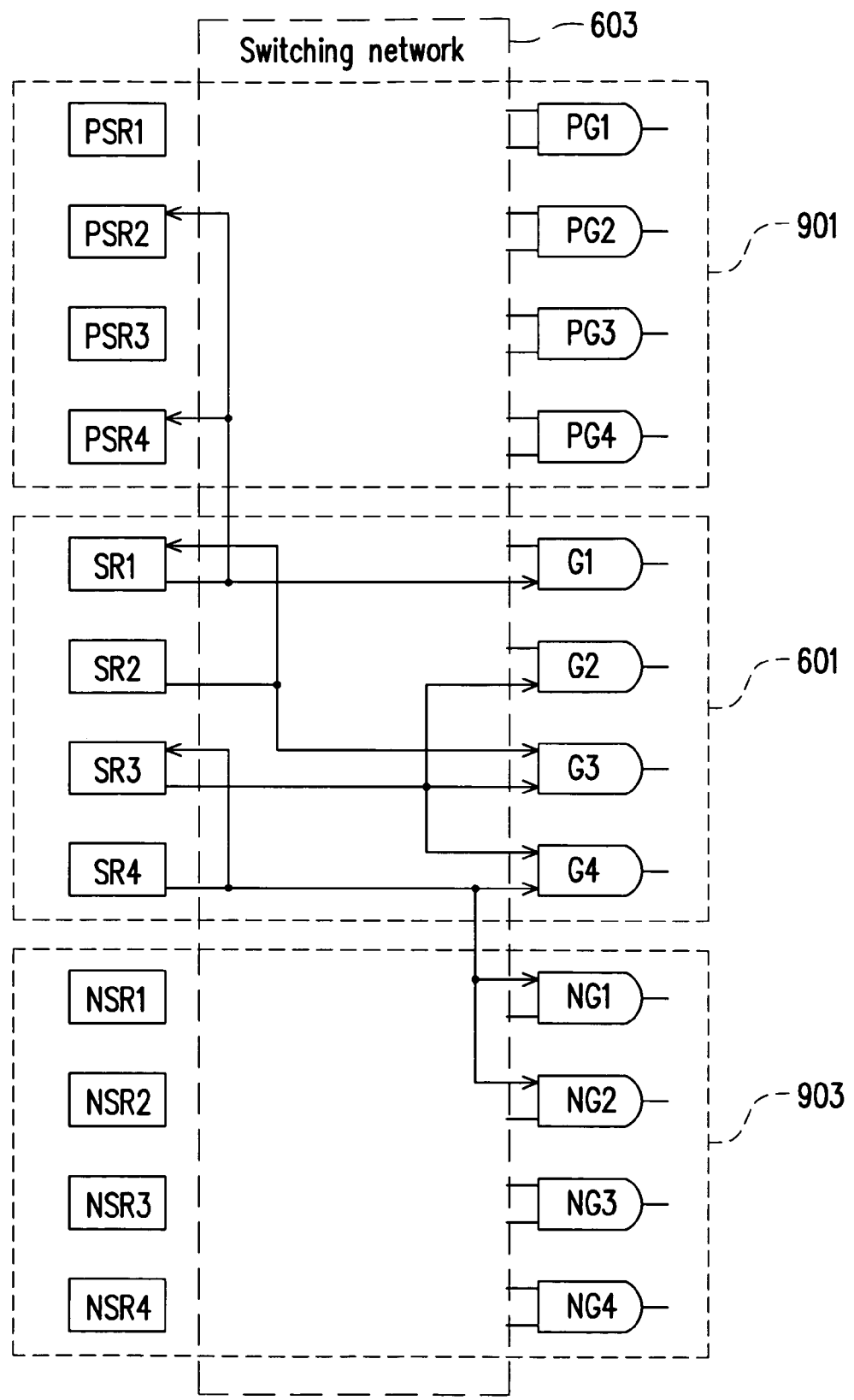
FIG. 7 and FIG. 8 are schematic diagrams showing the interconnection between shift registers and logic gates under the switching network of a dual resolution control circuit according to an embodiment of the present invention.
Figure 8:
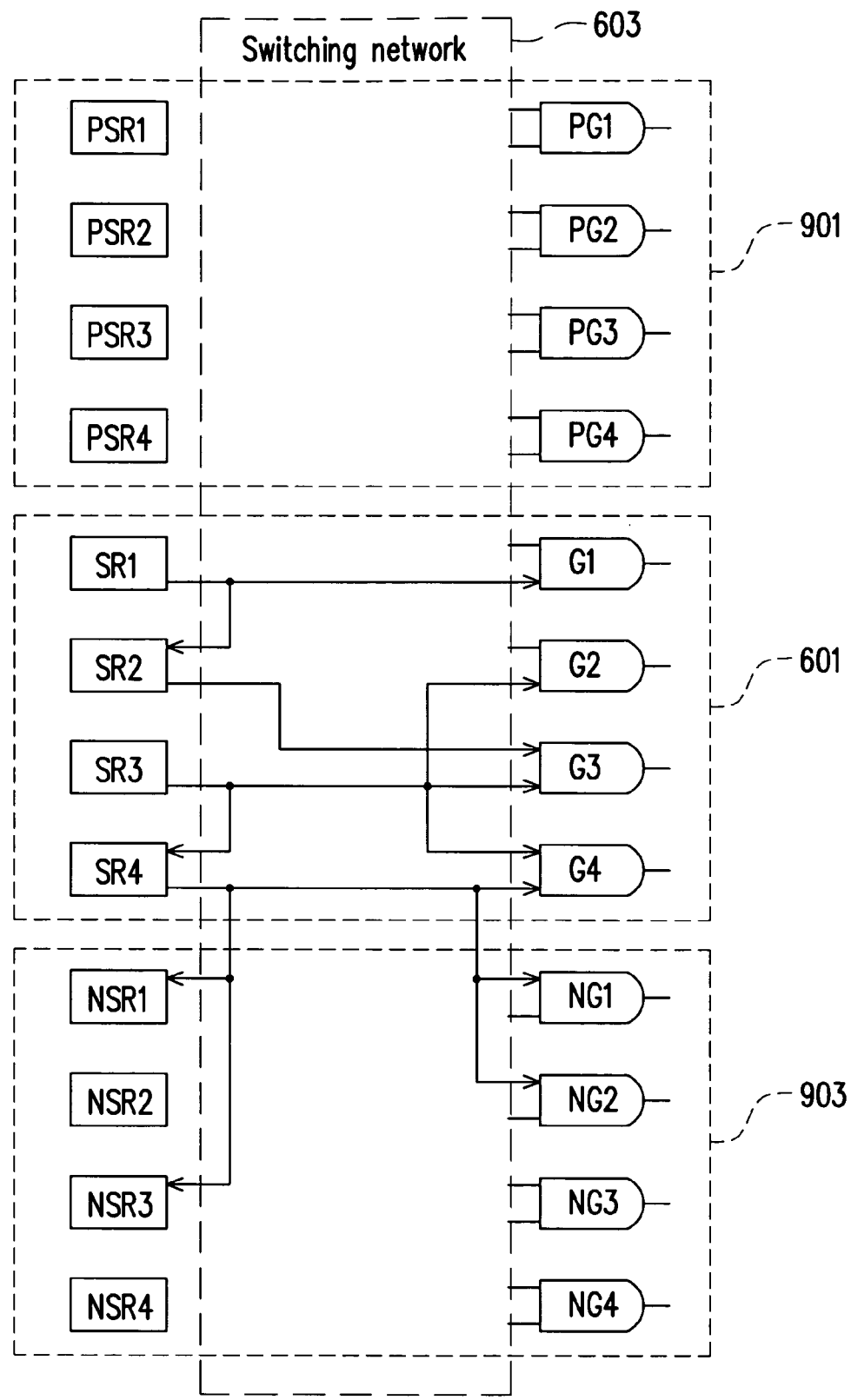

Table 2 below shows how the switching networks of this embodiment direct the shifting signals provided by the shift registers SR1~SR4 in the various situations mentioned above. For clarity, FIG. 7 and FIG. 8 further illustrate the connections between shift registers and logic gates of this embodiment when the display panel operates in the low resolution mode. In particular, FIG. 7 shows the connections when the display panel scans upward in the low resolution mode. FIG. 8 shows the connections when the display panel scans downward in the low resolution mode. As can be seen, there are three modules in FIG. 7 and FIG. 8, namely, the previous module 901, the central module 601 and the next module 903. The previous module 901 comprises the shift registers PSR1~PSR4 and the logic gates PG1~PG4. The central module 601 comprises the shift registers SR1~SR4 and the logic gates G1~G4. The next module 903 comprises the shift registers NSR1~NSR4 and the logic gates NG1~NG4. For simplicity, only the transmission paths starting from the central module 601 are shown in FIG. 7 and FIG. 8. Actually, the same transmission pattern is repeated in each module of this embodiment.

TABLE 2

| Resolution and scan direction | Shift register providing the shifting signal | Shift registers and logic gates receiving the shifting signal |
|---|---|---|
| Scanning upward in the high resolution mode | SR1 | PSR4, G1, G2 |
| | SR2 | SR1, G2, G3 |
| | SR3 | SR2, G3, G4 |
| | SR4 | SR3, G4, NG1 |
| Scanning downward in the high resolution mode | SR1 | SR2, G1, G2 |
| | SR2 | SR3, G2, G3 |
| | SR3 | SR4, G3, G4 |
| | SR4 | NSR1, G4, NG1 |
| Scanning upward in the low resolution mode | SR1 | G1, PSR2, PSR4 |
| | SR2 | SR1, G3 |
| | SR3 | G2, G3, G4 |
| | SR4 | SR3, G4, NG1, NG2 |
| Scanning downward in the low resolution mode | SR1 | SR2, G1 |
| | SR2 | G3 |
| | SR3 | SR4, G2, G3, G4 |
| | SR4 | G4, NSR1, NSR3, NG1, NG2 |

After referring to table 2, FIG. 7 and FIG. 8, one skilled in the relevant art can easily deduce that the logic gates receive correct shifting signals and generate correct panel control signals in the various situations mentioned above.

As can be seen in table 2 above and in FIG. 7 and FIG. 8, all shift registers are used even when the display panel is in the low resolution mode. Since there are no idle and floating shift registers, the problem caused by accumulated charges is potentially prevented.

Please note that the present invention is not limited to the embodiment discussed above. Regarding the transmission of the shifting signals from the shift registers to the logic gates, there are several variations of the general rule. According to a first variation, when the display panel operates in the low resolution mode, the shift register SR1 outputs a first shifting signal, and the shift register SR3 also outputs the same first shifting signal. The switching network directs the first shifting signal to each of the logic gates G1~G4. Furthermore, the shift register SR2 outputs a second shifting signal, and the shift register SR4 also outputs the same second shifting signal. The switching network directs the second shifting signal to the logic gates G3, G4, NG1 and NG2.

According to a second variation of the general rule, when the display panel operates in the low resolution mode, the shift register SR1 outputs a first shifting signal, and the shift register SR3 also outputs the same first shifting signal. The switching network directs the first shifting signal to the logic gates G1, G2, PG3 and PG4. Furthermore, the shift register SR2 outputs a second shifting signal, and the shift register SR4 also outputs the same second shifting signal. The switching network directs the second shifting signal to each of the logic gates G1~G4.

Regarding the transmission of the shifting signals among the shift registers themselves, the general rule is as follows. When the display panel scans upward in the low resolution mode, the shift registers SR1 and SR3 receive the shifting signal outputted by the shift register SR2 or the shift register SR4 as their start pulse inputs. Meanwhile, the shift registers SR2 and SR4 receive the shifting signal outputted by the shift register NSR1 or the shift register NSR3 as their start pulse inputs.

On the other hand, when the display panel scans downward in the low resolution mode, the shift registers SR1 and SR3 receive the shifting signal outputted by the shift register PSR2 or the shift register PSR4 as their start pulse inputs. Meanwhile, the shift registers SR2 and SR4 receive the shifting signal outputted by the shift register SR1 or the shift register SR3 as their start pulse inputs.

Figure 9:
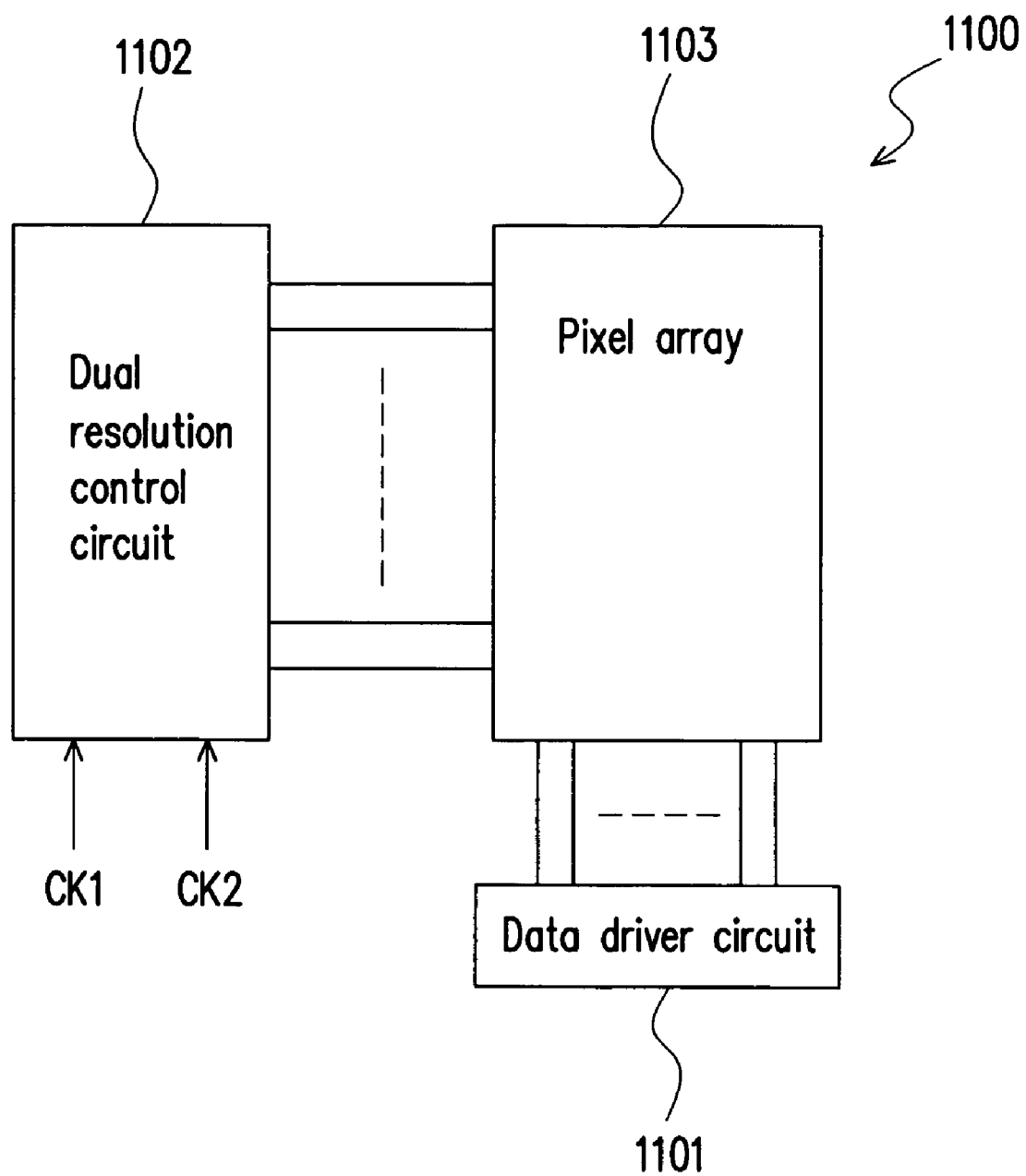
FIG. 9 is a schematic diagram showing the structure of an display panel according to an embodiment of the present invention.

Embodiments of a dual resolution control circuit can be used with display panels, such as shown in FIG. 10. FIG. 9 is a schematic diagram showing an display panel 1100 according to another embodiment of the present invention. The display panel 1100 comprises a data driver circuit 1101, a dual resolution control circuit 1102 and a pixel array 1103. The data driver circuit 1101 provides an image signal to the pixel array 1103. The dual resolution control circuit 1102 provides a plurality of panel control signals to the pixel array 1103 in a manner such as described before. The pixel array 1103 displays an image by loading the image signal into a plurality of pixels of the pixel array 1103 in response to the panel control signals. Because of the dual resolution control circuit 1102, the display panel 1100 might also prevent the problem caused by floating shift registers.

It will be apparent to those skilled in the art that various modifications and variations can be made to the structure of the present invention without departing from the scope or spirit of the invention. In view of the foregoing, it is intended that the present invention cover modifications and variations provided they fall within the scope of the following claims and their equivalents.

What is claimed is:

1. A system for providing dual resolution control of a display panel, said system comprising:
a dual resolution control circuit comprising:
first, second, third and fourth shift registers, each of the shift registers outputting a shifting signal;
first, second, third and fourth logic gates; and
a switching network, coupled among the shifting registers and the logic gates;
wherein, in a low resolution mode, the switching network directs the shifting signals to the shift registers such that each of the first and the third shift registers outputs a first shifting signal and each of the second and the fourth shift registers outputs a second shifting signal, the switching network also directs the shifting signals to the logic gates such that each of the first and the second logic gates outputs a first panel control signal and each of the third and the fourth logic gates outputs a second panel control signal, and wherein pulses of the first and the second panel control signals do not overlap,
wherein the phase of the shift signals of the first and the third shift registers are in-phase, the phase of the shift signals of the second and the fourth shift registers are in-phase, and
wherein the first, the second, the third and the fourth shift registers are not cascaded successively.

2. The system according to claim 1, wherein durations of the pulses of each of the shifting signals are at least twice as long as the durations of the pulses of each of the panel control signals.

3. The system according to claim 1, wherein, in the low resolution mode, the switching network directs the first shifting signal to each of the four logic gates, and directs the second shifting signal to the third logic gate, the fourth logic gate, a first logic gate of a next module, and a second logic gate of the next module.

4. The system according to claim 1, wherein, in the low resolution mode, the switching network directs the first shifting signal to a first logic gate, a second logic gate, a third logic gate of the previous module, and the fourth logic gate of the previous module, and directs the second shifting signal to each of the four logic gates.

5. The system according to claim 1, wherein each of the shift registers receives a first clock signal and a second clock signal, and receives a shifting signal from another shift register as its start pulse input; and each of the output terminals of the shift registers is connected through the switching network to at least one of the logic gates.

6. The system according to claim 5, wherein the first clock signal and the second clock signal have the same frequency and are in opposite phases.

7. The system according to claim 5, wherein the first shift register and the third shift register receive the first clock signal as their first inputs and the second clock signal as their second inputs, and the second shift register and the fourth shift register receive the first clock signal as their second inputs and the second clock signal as their first inputs.

8. The system according to claim 1, wherein each of the logic gates comprises one of the following: an AND gate, an NAND gate, an AND gate and an inverter connected in series, and an NAND gate and an inverter connected in series.

9. A system for providing dual resolution control of a display panel, said system comprising:
a dual resolution control circuit comprising:
first, second, third and fourth shift registers, each of the shift registers outputting a shifting signal;
first, second, third and fourth logic gates; and
a switching network, coupled among the shifting registers and the logic gates;
wherein, in a low resolution mode, the switching network directs the shifting signals to the shift registers such that each of the first and the third shift registers outputs a first shifting signal and each of the second and the fourth shift registers outputs a second shifting signal, the switching network also directs the shifting signals to the logic gates such that each of the first and the second logic gates outputs a first panel control signal and each of the third and the fourth logic gates outputs a second panel control signal, and wherein pulses of the first and the second panel control signals do not overlap;

wherein each of the shift registers receives a first clock signal and a second clock signal, and receives a shifting signal from another shift register as its start pulse input; and each of the output terminals of the shift registers is connected through the switching network to at least one of the logic gates; and wherein, during upward scan in the low resolution mode, the first shift register and the third shift register receive the shifting signal outputted by the second shift register or the fourth shift register as their start pulse inputs, and the second shift register and the fourth shift register receive the shifting signal outputted by the first shift register of the next module or the third shift register of the next module as their start pulse inputs, and wherein the first, the second, the third and the fourth shift registers are not cascaded successively.

10. The system according to claim 9, wherein durations of the pulses of each of the shifting signals are at least twice as long as the durations of the pulses of each of the panel control signals.

11. The system according to claim 9, wherein, in the low resolution mode, the switching network directs the first shifting signal to each of the four logic gates, and directs the second shifting signal to the third logic gate, the fourth logic gate, a first logic gate of a next module, and a second logic gate of the next module.

12. The system according to claim 9, wherein, in the low resolution mode, the switching network directs the first shifting signal to a first logic gate, a second logic gate, a third logic gate of the previous module, and the fourth logic gate of the previous module, and directs the second shifting signal to each of the four logic gates.

13. A system for providing dual resolution control of a display panel, said system comprising:
    a dual resolution control circuit comprising:
        first, second, third and fourth shift registers, each of the shift registers outputting a shifting signal;
        first, second, third and fourth logic gates; and
        a switching network, coupled among the shifting registers and the logic gates;
    wherein, in a low resolution mode, the switching network directs the shifting signals to the shift registers such that each of the first and the third shift registers outputs a first shifting signal and each of the second and the fourth shift registers outputs a second shifting signal, the switching network also directs the shifting signals to the logic gates such that each of the first and the second logic gates outputs a first panel control signal and each of the third and the fourth logic gates outputs a second panel control signal, and wherein pulses of the first and the second panel control signals do not overlap;

wherein each of the shift registers receives a first clock signal and a second clock signal, and receives a shifting signal from another shift register as its start pulse input; and each of the output terminals of the shift registers is connected through the switching network to at least one of the logic gates; and wherein, during downward scan in the low resolution mode, the first shift register and the third shift register receive the shifting signal outputted by the second shift register of the previous module or the fourth shift register of the previous module as their start pulse inputs, and the second shift register and the fourth shift register receive the shifting signal outputted by the first shift register or the third shift register as their start pulse inputs, and wherein the first, the second, the third and the fourth shift registers are not cascaded successively.

14. The system according to claim 13, wherein the first clock signal and the second clock signal have the same frequency and are in opposite phases.

15. The system according to claim 13, wherein the first shift register and the third shift register receive the first clock signal as their first inputs and the second clock signal as their second inputs, and the second shift register and the fourth shift register receive the first clock signal as their second inputs and the second clock signal as their first inputs.

16. The system according to claim 13, wherein each of the logic gates comprises one of the following: an AND gate, an NAND gate, an AND gate and an inverter connected in series, and an NAND gate and an inverter connected in series.

17. A system for providing dual resolution control of a display panel, said system comprising:
    a first pair and a second pair of shift registers, each of the shift registers outputting a shifting signal;
    a first pair and a second pair of logic gates; and
    a switching network coupled among the shifting registers and the logic gates;
    wherein, in a low resolution mode, the switching network causes the shift registers to output shifting signals, the phase of the shift signals of the shift registers of the first pair are in-phase, the phase of the shift signals of the shift registers of the second pair are in-phase, with corresponding pulses of the shifting signals of the shift registers of the first pair temporally overlapping with corresponding pulses of the shifting signals of the shift registers of the second pair; and
    wherein, responsive to the shifting signals, the logic gates output panel control signals, with corresponding pulses of the panel control signals of the logic gates of the first pair not temporally overlapping with corresponding pulses of the panel control signals of the logic gates of the second pair, and
    wherein the first, the second, the third and the fourth shift registers are not cascaded successively.

* * * * *